United States Patent [19]

Miyachi et al.

[11] Patent Number: 5,521,939
[45] Date of Patent: May 28, 1996

[54] TIMING REPRODUCTION DEVICE

[75] Inventors: Tatsuo Miyachi, Tokyo; Hiroki Uchiyama, Yokohama, both of Japan

[73] Assignee: Ricoh Company, Ltd., Tokyo, Japan

[21] Appl. No.: 998,682

[22] Filed: Dec. 30, 1992

[30] Foreign Application Priority Data

Jan. 6, 1992 [JP] Japan ..................... 4-018581

[51] Int. Cl.⁶ .................. H04B 1/38; H04L 5/16
[52] U.S. Cl. .............. 375/222; 455/226.1; 455/73
[58] Field of Search ................ 375/8, 7, 106, 375/118, 108; 455/226.1, 232.1, 240.1, 73, 74

[56] References Cited

U.S. PATENT DOCUMENTS

| 4,633,193 | 12/1986 | Scordo ................ | 375/108 X |
| 4,849,997 | 7/1989 | Suzuki et al. ........... | 375/8 X |
| 4,956,851 | 9/1990 | Wolensky et al. ........ | 375/8 |

FOREIGN PATENT DOCUMENTS 3739565  6/1989  Germany.

OTHER PUBLICATIONS

Uchiyama et al, "Voiceband Modem Control Algorithm for Improving Image Quality of Mobile Telephone Facsimile." 1992 IEEE International Conf. on Selected Topics in Wireless Communications 25–26 Jun. 1992 pp. 324–327.

Kaga, "Interface", CQ Shuppan-sha, Apr., 1986.

IEEE Transactions On Communications, vol. 36, No. 9, Sep. 1988, pp. 1035–1043, H. Sari , et al., "New Phase and Frequency Detectors for Carrier Recovery in PSK and QAM System".

*Primary Examiner*—Stephen Chin
*Assistant Examiner*—Bryan Webster
*Attorney, Agent, or Firm*—Oblon, Spivak, McClelland, Maier & Neustadt

[57] ABSTRACT

A timing reproduction device includes a timing error detector for detecting an error in timing of a signal transferred between a transmission side and a reception side on the basis of a received signal and for generating a timing error signal. An integrator integrates the timing error signal to thereby hold data necessary to maintain a timing synchronization. A sensing unit senses abrupt timing change in the received signal. A timing synchronizing unit executes a timing synchronizing operation for maintaining the timing synchronization by referring the data held in the integrator. A cutoff unit executes a cutoff operation which prevents the timing error signal from being applied to the integrator on the basis of the abrupt timing change sensed by the sensing unit.

14 Claims, 14 Drawing Sheets

TIMING REPRODUCTION DEVICE

BACKGROUND OF THE INVENTION

1. Field of the Invention

The present invention generally relates to a timing reproduction device that reproduces a timing signal from a received signal in a communications system. The present invention is suitably applicable to a modulator/demodulator device (modem) in communications devices, such as a data transmission device and a facsimile device.

2. Description of the Prior Art

In communications systems, a timing reproduction device is used which extracts, from a received signal, a timing error between signals transmitted between a transmitter and a receiver and reproduces a timing signal used in the transmitter on the receiver side in order to synchronize the receiver with the transmitter.

FIG. 1 is a block diagram of a conventional timing reproduction device disclosed in Kaga, "INTERFACE", CQ Shuppan-sha, April, 1986. The timing reproduction device shown in FIG. 1 converts an analog received via a transmission medium by an analog-to-digital (A/D) converter 501. A digital signal output by the A/D converter 501 is demodulated by a demodulator 502. A demodulated digital signal from the demodulator 502 is converted into baseband signals $a_1$ and $a_2$ by receiving filters 503 and 504. The baseband signals $a_1$ and $a2$ are handled as a complex number. A complex number operation unit 505 computes the absolute value $a_1^2+a2^2$ of the complex number. A signal indicating the absolute value $a_1^2+a2^2$ from the operation unit 505 passes through a band-pass filter (BPF) 506, and is applied to a timing error inferring unit 507, which monitors the output signal of the band-pass filter 506, and derives a deviation between the timings of transmission and reception from the output signal. The above deviation is output to an integrator 508 as a timing error signal TE. The integrator 508 integrates the timing error signals TE consecutively supplied from the unit 507. When an overflow OVF of integration occurs due to the fact that the value obtained by integrating the timing error signals TE exceeds a predetermined value, the integrator 508 sends an overflow signal OVF to a frequency-dividing counter 509, which controls the frequency of a basic clock signal and applies, as a sampling clock signal, a frequency-controlled clock signal to the A/D converter 501.

When the overflow OVF occurs, the sampling rate of the sampling clock signal is subjected to a feed-back control so that the timing error becomes zero. In this manner, the receiver can be synchronized with the transmitter.

The conventional timing reproduction device shown in FIG. 1 is suitable for communications systems using normal public lines, in which the timing between the transmitter and the receiver does not abruptly change. In such communications systems, it is sufficient to suppress steady timing error between the transmitter and the receiver after the receiver has been pulled into synchronism with the transmitter. The conventional timing reproduction device shown in FIG. 1 is suitable for the above communications systems.

However, the configuration shown in FIG. 1 is not suitable for communications systems in which the timing between the transmitter and the receiver abruptly changes. The typical examples of these communications systems are mobile communications systems, such as an automobile telephone system and a portable telephone system. A movable communications device is needed to switch to communicate with another ground station due to a change in the location of the movable communications device. When the timing between the transmitter and the receiver abruptly changes, the value held in the integrator 508 greatly changes. Hence, it takes a long time to pull the receiver into synchronism with the transmitter.

SUMMARY OF THE INVENTION

It is a general object of the present invention to provide a timing reproduction device in which the above disadvantage is eliminated.

A more specific object of the present invention is to provide a timing reproduction device capable of rapidly re-establishing synchronization between the transmitter and the receiver even when the transmission timing between the transmitter and the receiver greatly changes.

The above objects of the present invention are achieved by a timing reproduction device comprising: timing error detecting means for detecting an error in timing of a signal transferred between a transmission side and a reception side on the basis of a received signal and for generating a timing error signal; integrating means, coupled to the timing error detecting means, for integrating the timing error signal to thereby hold data necessary to maintain a timing synchronization; sensing means for sensing abnormality in the received signal; timing synchronizing means, coupled to the timing error detecting means, for executing a timing synchronizing operation fop maintaining the timing synchronization by referring the data held in the integrating means; and cutoff means, coupled between the timing error detecting means and the integrating means and connected to the sensing means, for executing a cutoff operation which prevents the timing error signal from being applied to the integrating means on the basis of the abnormality sensed by the sensing means.

The above objects of the present invention is also achieved by a timing reproduction device comprising: timing error detecting means for detecting an error in timing of a signal transferred between a transmission side and a reception side on the basis of a received signal and for generating a timing error signal; sensing means for sensing abnormality in the received signal; variable gain means, coupled to the timing error detecting means, for changing a variable gain and for multiplying the timing error signal by the variable gain on the basis of the abnormality in the input signal and for generating a gain-controlled timing error signal; integrating means, coupled to the variable gain means, for integrating the gain-controlled timing error signal to thereby hold data necessary to maintain a timing synchronization; and timing synchronizing means, coupled to the timing error detecting means, for executing a timing synchronizing operation for maintaining the timing synchronization by referring the data held in the integrating means.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
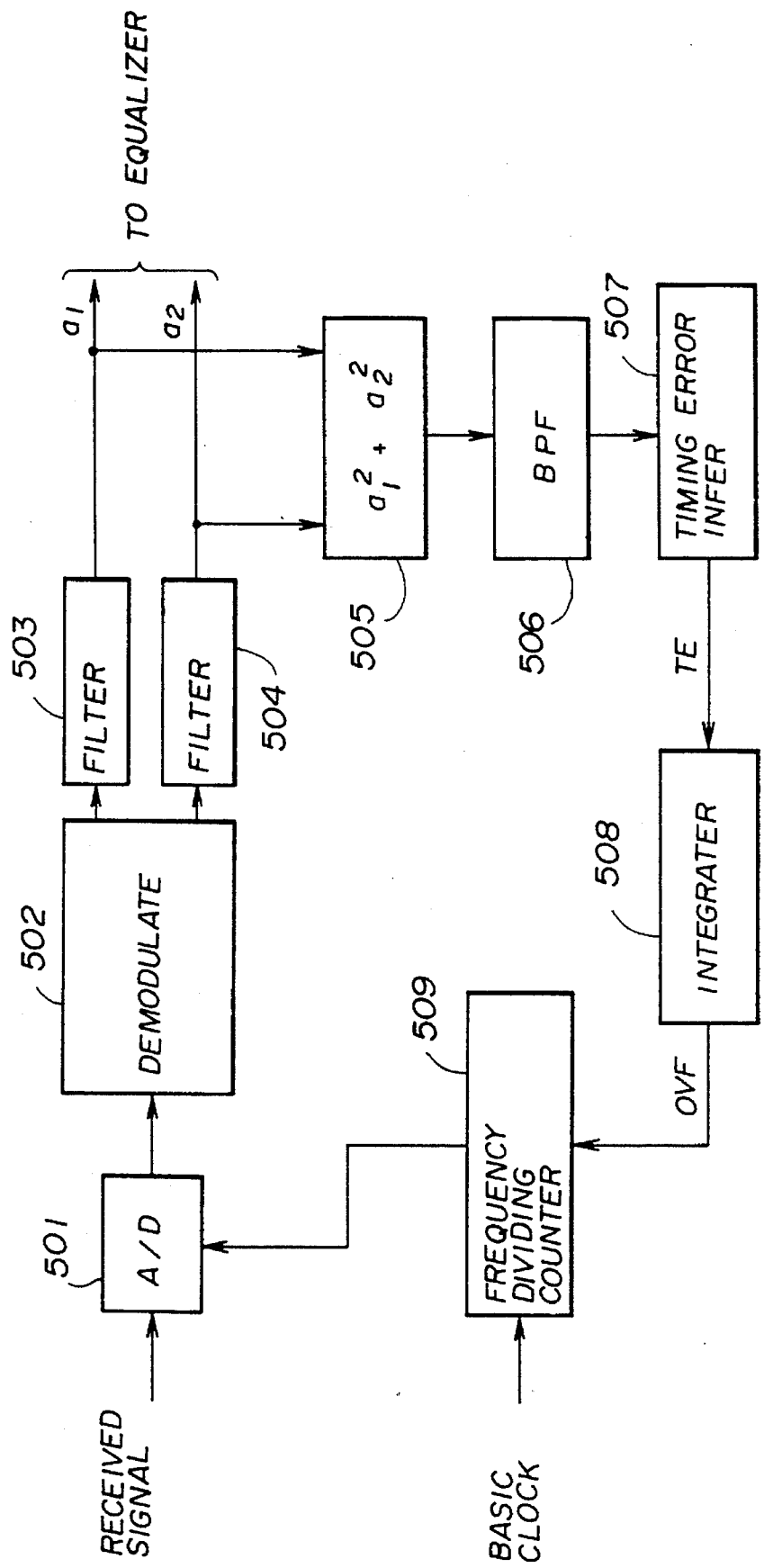
FIG. 1 is a block diagram of a conventional timing reproduction device.
Figure 2:
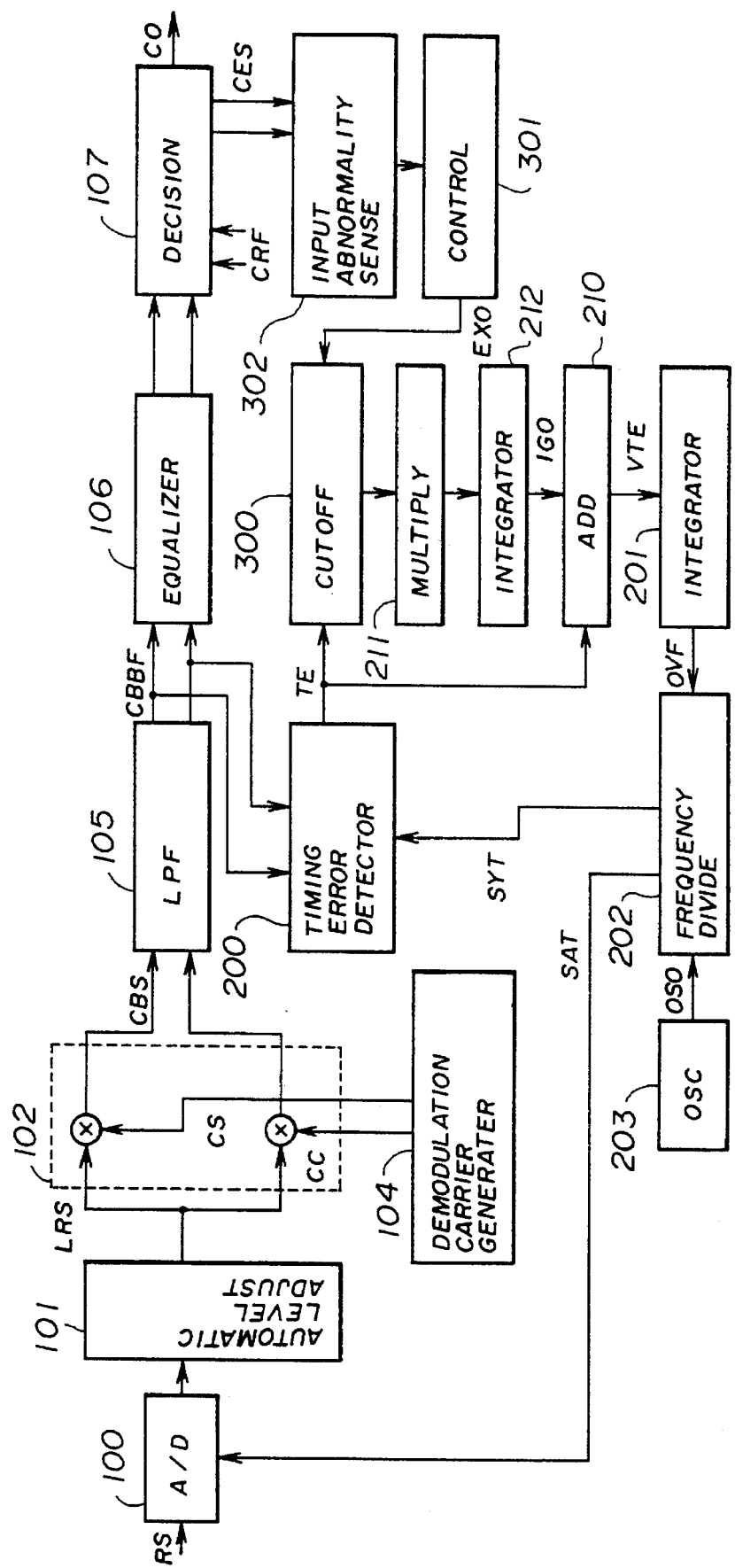
FIG. 2 is a block diagram of a modem including a timing reproduction device according to a first embodiment of the present invention.

FIG. 2 shows a modem including a timing reproduction device according to a first embodiment of the present invention. The modem shown in FIG. 2 comprises an A/D converter 100, an automatic level adjuster 101, a demodulator 102, a demodulation carrier generator 104, a low-pass filter 105, an equalizer 106, and a decision unit 107.

The A/D converter 100 converts an analog signal RS received via a transmission medium into a digital signal. The automatic level adjuster 101 adjusts the digital signal from the A/D converter so that it has a fixed level. The demodulation carrier generator 104 generates demodulation carrier signals CS and CC, which have a 90° phase difference. The demodulator 102 includes first and second multipliers. The first multipliers multiplies a signal LRS output from the automatic level adjuster 101 by the demodulation carrier signal CS. The second multipliers multiplies the signal LRS by the demodulation carrier signal CC. In this manner, the demodulator 102 generates a complex baseband signal CBS. The low-pass filter 105 eliminates unwanted high-frequency components from the complex baseband signal CBS, and generates a complex baseband signal CBBF. The equalizer 106 executes a transmission medium compensation for the complex baseband signal CBBF, and generates a signal CBSF. The decision unit 107 compares the signal CBSF with a predetermined reference signal CRF, and a decoded signal CO dependent on the result of the comparison. Further, the decision unit 107 generates a complex decision error signal CES corresponding to the difference between the signal CBSF and the signal CRF. The complex decision error signal CES is used to update tap coefficients of the equalizer 106 and synchronize the phase of a carrier signal in accordance with a phase error component (error in the angle of a decision point) obtained from the signal CES. It is possible to synchronize the phase of the carrier signal by a shifter (not shown) provided between the equalizer 106 and the decision unit 107, or by directly controlling the complex carrier generator 104.

In order to perform a timing reproducing operation, the modem shown in FIG. 2 comprises a timing error detector 200, an integrator 201, a frequency divider 202, an oscillator 203, a multiplier 211, an integrator 212, an adder 210, a cut-off unit 300, a controller 301, and an input abnormality sensing unit 302.

The oscillator 203 generates a clock signal OSO having a predetermined frequency (equal to an integer multiple of a symbol frequency employed between the transmitter and the receiver). The frequency divider 202 divides the frequency of the clock signal OSC at given dividing rates, and thereby generates sample timing signal SAT and a symbol timing signal SYT. The sample timing signal SAT is applied to the A/D converter 100, and the symbol timing signal (symbol-rate sample clock signal) SYT to the timing error detector 200. More particularly, the sample timing signal SAT is generated by frequency-dividing the clock signal OSO at a predetermined frequency-dividing rate, and the symbol-timing signal SYT is generated by frequency-dividing the sample timing signal SAT at a predetermined frequency-dividing rate. The frequency divider 202 receives the overflow signal OVF from the integrator 201, and updates the frequency-dividing rate M by +1 (M+1) when the overflow signal OVF indicates a value "+1". Further, the frequency divider 202 updates the frequency-dividing rate M by −1 (M−1) when the overflow signal OVF assumes a value "−1".

The timing error detector 200 compares the signal CBBF from the low-pass filter 105 with the symbol timing signal SYT from the frequency divider 202, and generates the timing error signal TE dependent on the timing difference between the signals CBBF and SYT. More particularly, the timing error signal TE indicates a positive value when the signal SYT is in advance of the signal CBBF, and indicates a negative value when the signal SYT lags behind the signal CBBF.

Figure 3:
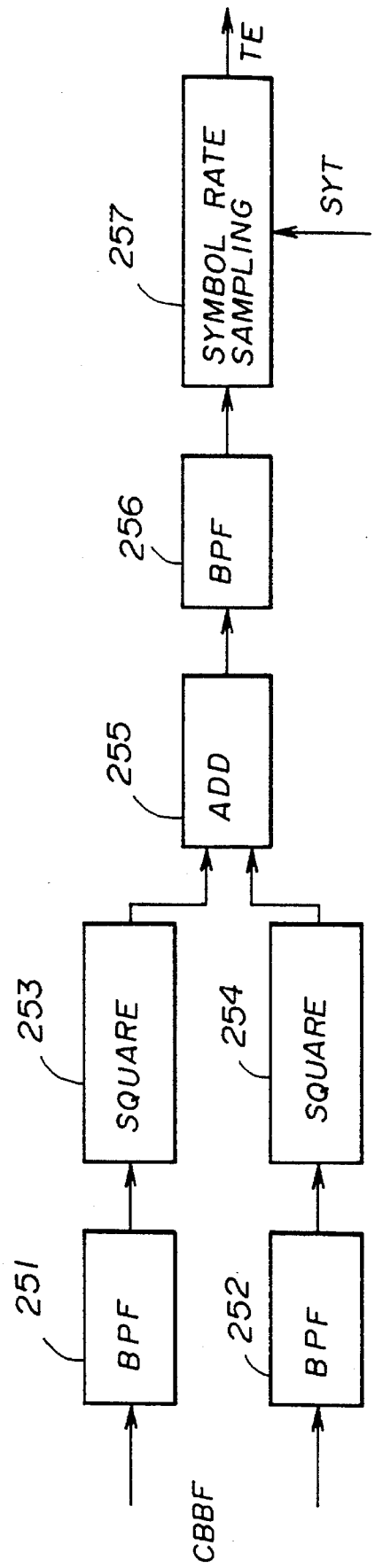
FIG. 3 is a block diagram of a timing error detector shown in FIG. 2.

FIG. 3 is a block diagram of the timing error detector 200, which comprises band-pass filters 251 and 252, square circuits 253 and 254, an adder 255, a band-pass filter 256, and a symbol-rate sampling circuit 257. These structural elements correspond to the aforementioned receiving filters 503 and 504, the complex operation unit 505, the band-pass filter 506, the timing inferring unit 507.

The timing error signal TE from the timing error detector 200 is directly applied to the adder 210, and is applied to the multiplier 211 via the cutoff unit 300 (which will be described later). The multiplier 211 multiplies the timing error signal TE received via the cutoff unit 300 by a predetermined coefficient, and outputs the result of the multiplication to the integrator 212. An output signal IGO of the integrator 212 is applied to the adder 210, which adds the timing error signal TE to the signal IGO and outputs a signal VTE corresponding to the result of the addition to the integrator 201.

The integrator 201 integrates the signal VTE, and resets the integrated result to "0" when the result of the integration reaches to a threshold value THIP (a positive value) or a threshold value THIN (a negative value). At this time, the integrator 201 generates the overflow signal OVF. More particularly, when the integrated result becomes greater than the positive threshold value THIP, the integrator 201 continues to generate the overflow signal OVF indicating "+1" during a predetermined period of time. When the integrated result becomes smaller than the negative threshold value THIN, the integrator 201 continues to generate the overflow signal OVF indicating "−1" during the predetermined period of time. Further, when the integrated result falls into the range between the threshold values THIP and THIN, the integrator 201 generates the overflow signal OVF indicating "0".

In the timing reproduction device according to the first embodiment of the present invention, timing information can be extracted from the received signal by means of the band-pass filters 251 and 252, the square circuits 253 and 254, the adder circuit 255 and the band-pass filter 256 provided in the timing error detector 200. The timing information thus extracted is sampled at the symbol-rate sampling circuit 257, so that the difference (error) between the timing information contained in the received signal and the symbol timing signal SYT. The frequency-dividing rate of the frequency divider 202 is changed so that the above difference decreases. In this manner, the timing synchronization is established.

Figure 5:
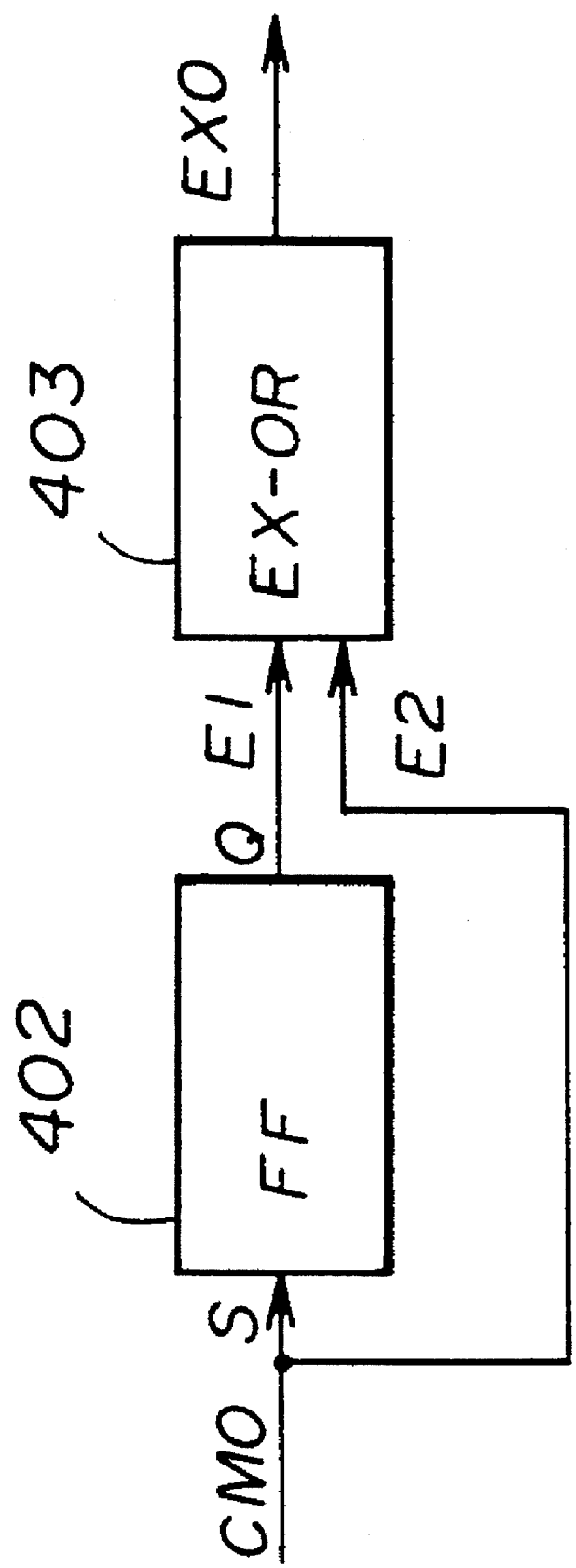
FIG. 5 is a block diagram of a controller shown in FIG. 2.

The arrangement in which the multiplier 211, the integrator 212 and the adder 210 are provided in the previous stages of the integrator 201 is proposed in "FOUNDATION AND APPLICATION OF DIGITAL PLL", Torikeppus, Jul. 4, 1990, pp.84, FIG. 5. The multiplier 211, the integrator 212 and the adder 210 function to reduce the steady phase error in a state in which the symbol frequencies in the transmitter and the receiver are different from each other. That is, when the symbol frequency used in the transmitter is different from that used in the receiver, it is necessary to continuously generate the overflow signal OVF at a frequency dependent on the difference between the symbol frequencies in order to maintaining timing synchronization. In a case where there is no difference between the symbol frequencies in the transmitter and the receiver while there is only the phase difference, the overflow signal OVF is generated a predetermined number of times and the phase difference is corrected. Thereafter, the overflow signal OVF is not generated.

In case where the multiplier 211, the integrator 212 and the adder 210 are not provided in the timing reproduction device, it is necessary for the input to the integrator 201, that is, the timing error signal TE to have a value of "0" in order to output the overflow signal OVF. That is, when there is the difference between the symbol frequencies used in the transmitter and the receiver, the timing error signal TE does not indicate "0" in a state in which the timing reproduction device is maintained in the stable state and the timing synchronization is maintained after it is established. That is, a steady phase error remains.

In the case where the multiplier 211, the integrator 212 and the adder 210 are employed in the modem, the overflow signal OVF in response to the timing error signal TE is output as in the above case. However, where the timing error signal TE is integrated by the integrator 212 and the positive (or negative) timing error signal is generated, the output signal IGO of the integrator 212 gradually increases (decreases). The output signal IGO of the integrator 212 is applied to the integrator 201 via the adder, and hence the frequency of generation of the overflow signal OVF increases as the output signal IGO of the integrator 212 increases. When the frequency of generation of the overflow signal OVF balances the difference between the symbol frequencies in the transmitter and the receiver, the correction of the frequency difference is completed, and the phase error becomes "0", the timing error signal TE indicates "0", which is applied to the integrator 212. As a result, the output signal IGO of the integrator 212 stops increasing, and a fixed output IGO integrated up to now is held in the integrator 212. Thereafter, the fixed output signal IGO is always applied to the adder 210. That is, the integrator 212 is provided for holding the value necessary to maintain the timing synchronization in the steady state after the timing synchronization is established. Due to the function of the integrator 212 and the adder 210, the timing error signal TE can be made "0" after the timing synchronization is established. Hence, the steady phase error can be reduced to "0".

In a phenomenon in which the timing abruptly changes in mobile communications systems, the difference between the symbol frequencies in the transmitter and the receiver seldom changes, and normally only the phase changes. In order to minimize the influence on the timing synchronization when the timing abruptly changes, the value held in the integrator 212 should be maintained irrespective of a change in the timing. The first embodiment of the present invention pays attention to the fact that the timing abruptly changes in such a case that a movable station switches to communicate with another ground station (switching of zones) due to a positional change of the movable station and that in many cases, an instantaneous break in the received signal is caused by an abrupt change in the timing. With the above in mind, a state where an abrupt change in the timing will occur is detected, and the timing error signal TE is prevented from being applied to the integrator 212 when such a state is detected. For this purpose, the cutoff unit 300, the controller 301 and the input abnormality sensing unit 302 are provided.

Figure 4:
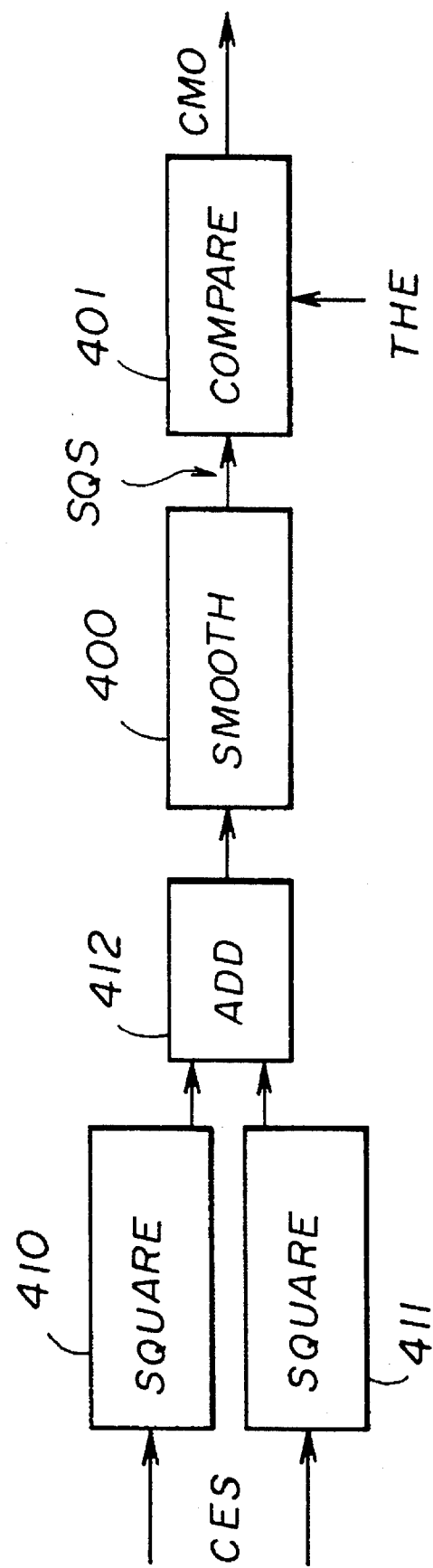
FIG. 4 is a block diagram of an input abnormality sensing unit shown in FIG. 2.

FIG. 4 shows the input abnormality sensing unit 302, and FIG. 5 shows the controller 301. Referring to FIG. 4, the input abnormality sensing unit 302 comprises square circuits 410 and 411, an adder 412, a smoothing circuit 400, and a comparator circuit 401. The square circuit 410 squares the real part of the complex decision error signal CES from the decision unit 107, and the square circuit 411 squares the imaginary part thereof. The adder 412 adds the output signals of the square circuits 410 and 411 to each other. The smoothing circuit 400 smooths the output signal of the adder 412, and generates a smoothed output signal SQS. The comparator circuit 401 compares the signal SQS with a threshold value THE. The comparator circuit 401 generates a comparison result signal CMO indicating "1" when the signal SQS is greater than the threshold value THE and indicating "0" in other cases. The value "1" of the comparison result signal CMO indicates abnormality in the input signal.

Referring to FIG. 5, the controller 301 comprises a flip-flop circuit 402, and an exclusive-OR circuit 403. The comparison result signal CMO from the comparator circuit 401 is applied to a set terminal S of the flip-flop circuit 402, and an input terminal E2 of the exclusive-OR circuit 403. An output signal via an output terminal Q of the flip-flop circuit 402 is applied to an input terminal E1 of the exclusive-OR circuit 403.

The cutoff unit 300 is supplied with an output signal EXO of the exclusive-OR circuit 403, which executes a cutoff control in accordance with the value ("1" or "0") of the output signal EXO.

A description will now be given of the operation of the timing reproduction device having the above-mentioned structure. The oscillator 203 (FIG. 2) generates the clock signal OSO having a frequency equal to an integral multiple of the frequency of a symbol frequency FSY. The clock signal OSO of the oscillator 203 is subjected to a frequency-dividing operation by the frequency divider 202, which generates a symbol timing signal SYT, and a sample timing signal SAT. The symbol timing signal SYT is applied to the timing error detector 200, and the sample timing signal SAT is applied to the A/D converter 100. When the symbol timing signal SYT applied to the timing error detector 200 is in advance of the signal CBBF output by the low-pass filter 105, the timing error signal TE from the timing error detector 200 indicates a positive value.

In the case where there is no abrupt change in the timing, the cutoff unit 300 does not operate. At this time, the positive timing error signal TE from the timing error detector 200 is applied to the adder 210, and is multiplied by the predetermined coefficient by the multiplier 211. The output signal of the multiplier 211 is applied to the integrator 212. The output signal IGO of the integrator 212 is input to the adder 210 in which it is added to the timing error signal TE. The output signal VTE of the adder 210 is applied to the integrator 201, which time-integrates the output signal VTE.

When the above operation is repeatedly performed and the result of the integration reaches to the positive threshold value THIP, the integrator 201 outputs the overflow signal OVF assuming "+1" to the frequency divider 202. Hence, the frequency divider 202 divides the frequency OSO from the oscillator 203 at the updated rate (M+1). As a result, the frequencies of the sample timing signal SAT and the symbol timing signal SYT slightly decrease (become lower than the current frequencies thereof). Hence an advance of the symbol timing signal SYT with respect to the signal CBBF can be reduced. On the other hand, when the timing error signal indicating a negative value is generated and the result of the integration reaches to the negative threshold value THIN, the integrator 201 outputs the overflow signal OVF indicating "−1" to the frequency divider 202. Hence, the frequency divider 202 divides the frequency of the frequency OSSO from the oscillator 203 at the updated rate (M−1). As a result, the frequencies of the sample timing signal SAT and the symbol timing signal SYT slightly increase (become higher than the current frequencies thereof). Hence, the sample timing signal SAT and the symbol timing signal SYT can slightly advance, and a delay in the symbol timing signal SYT with respect to the signal CBBF can be reduced.

In the above-mentioned manner, the timing synchronization can be established when the symbol frequencies in the transmitter and the receiver are equal to each other and only the phase difference between the symbols in the transmitter and the receiver exists in the state in which there is no abrupt change in the timing. After the timing synchronization is established under the above condition, the average value of the timing error signals TE is approximately "0", and the result of the integration executed in the integrator 212 is approximately "0".

In the case where there is the difference between the symbol frequencies in the transmitter and the receiver, the timing error signals TE are successively generated in the prosecution of establishing the timing synchronization. Hence, the average value of the timing error signals TE is not "0", but a positive or negative value. The timing error signals TE are integrated by the integrator 212. The output signal IGO of the integrator 212 gradually changes, and the absolute value thereof increases. The output signal IGO is added to the timing error signal TE at the adder 210, which generates the signal VTE. This signal VTE is integrated by the integrator 201, which generates the overflow signal OVF. Since the signal IGO gradually changes, the frequency of occurrence of the overflow signals OVF having values other than "0" increases. After the timing synchronization is established through the above prosecution, the average value of the timing error signals TE from the timing error detector 200 is approximately "0", and the output signal IGO of the integrator 212 is stable in the state in which it holds the value dependent on the difference between the symbol frequencies used in the transmitter and the receiver. Thus, the integrator 201 can generate the overflow signal OVF indicating a value other than "0" at the frequency dependent on the value of the output signal IGO of the integrator 212. In this manner, the steady timing adjustment can be performed. As a result, the steady phase error can be keep small.

As described above, the timing between the transmitter and the receiver seldom changes abruptly. Hence, after the timing synchronization is established, the steady phase error can be kept small by holding the integrator 212.

However, in the mobile communications systems, an abrupt timing change occurs when a movable station switches to communicate with another ground station (switching of zones) due to a positional change of the movable station. At this time, the timing error signal TE indicating a great value is generated. In case where the cutoff unit 300 is not provided, the timing error signals TE indicating great values are consecutively applied to the integrator 212 during a certain period of time. Hence, the value held in the integrator 212 changes. In this case, it will take a long time to recover the timing synchronization.

However, according to the first embodiment of the present invention, the cutoff unit 300 prevents the timing error signal TE from being applied to the integrator 212 when it is determined that an abrupt timing change will occur.

More particularly, the complex decision error signal CES from the decision unit 107 is applied to the input abnormality sensing unit 302, which computes the sum of the squared real part and the squared imaginary part. Then, the above sum is compared with the threshold value THE, so that the occurrence of an instantaneous break is sensed. More particularly, when the received signal is instantaneously broken, the output signal CBSF of the equalizer 108 becomes "0", the absolute value of the signal CES corresponding to the difference between the CBSF and the CRF indicates a large value, and is greater than the square sum SQS of the signal CES (strictly speaking, the smoothed square sum) indicates a large value. Hence, the comparator 401 of the input abnormality sensing unit 302 outputs the sensing result CMO equal to "1" to the controller 301. In response to the sensing result CMO "1", the flip-flop 402 of the controller 301 is set and outputs the value "1" via the output terminal Q. The input terminal E2 of the exclusive-OR circuit 403 is also supplied with the sensing result CMO "1", and the output signal EXO of the exclusive-OR circuit 403 is maintained at "0". The flip-flop 402 is reset at the commencement of communications. In the state before the input signals E1 and E2 of the exclusive-OR circuit 403 are supplied with "0", and he output signal EXO is "0".

After the instantaneous break is sensed, the output signal EXO is maintained at "0" during a time when the instantaneous break continues. When the received signal is recovered, the signal SQS decreases, and the signal CMO returns to "0". Hence, the input signal E2 of the exclusive-OR gate 403 becomes "0". However, the output signal Q of the flip-flop 402 is maintained at "1", and hence the input signal E1 of the exclusive-OR circuit 403 indicates "1". As a result, the output signal EXO becomes 1. In the configuration shown in FIG. 5, the controller 301 senses the recovery of the received signal from the instantaneous break, and informs the cutoff unit 300 of the recovery.

The cutoff unit 300 executes the cutoff operation preventing the timing error signal TE from being applied to the multiplier 211 when the output signal EXO of the controller 301 is "1". When the signal EXO indicates "0", the cutoff operation is not performed, and the timing error signal TE is applied to the multiplier 211. Hence, when the received signal is recovered from the break, the output signal of the controller 301 indicates "1", and the timing error signal TE is not applied to the multiplier 211 and thus the integrator 212. As a result, even if the received signal is recovered from the break and the timing abruptly changes, the value held in the integrator 212 is still maintained. Hence, it is sufficient to correct only the phase shift in the timing, and the timing synchronization can be easily recovered. Hence, the timing synchronization can be rapidly recovered.

Figure 6:
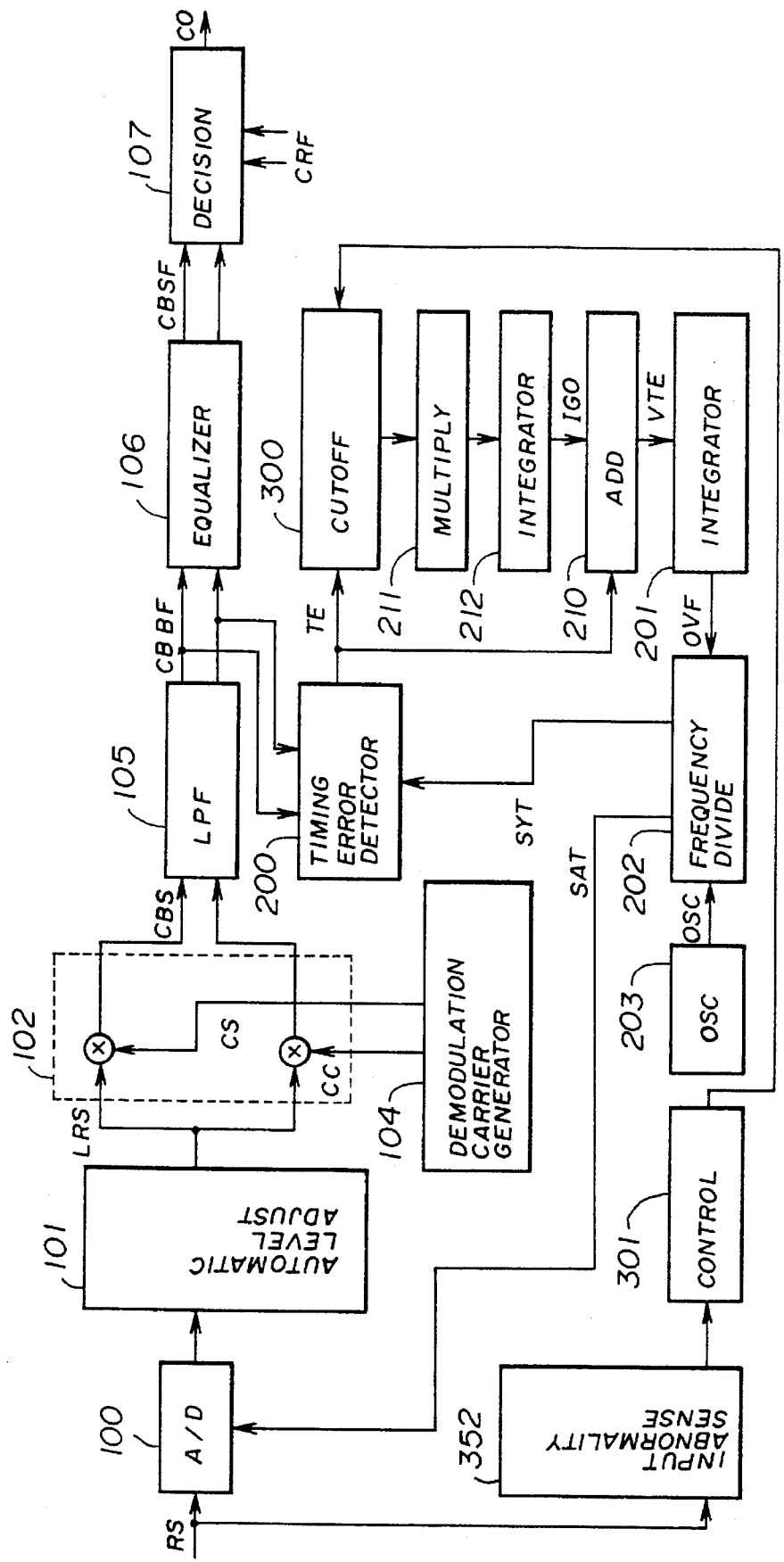
FIG. 6 is a block diagram of a variation of the timing reproduction device shown in FIG. 2.

FIG. 6 shows a variation of the timing reproduction device. In FIG. 6, parts that are the same as parts shown in FIG. 2 are given the same reference numbers as previously. In the timing reproduction device shown in FIG. 6, an input abnormality sensing unit 352 does not sense the instantaneous break of the received signal RS on the basis of the complex error signal CES from the decision unit 107, but senses an instantaneous break of the received signal RS from the received signal RS itself.

Figure 7:
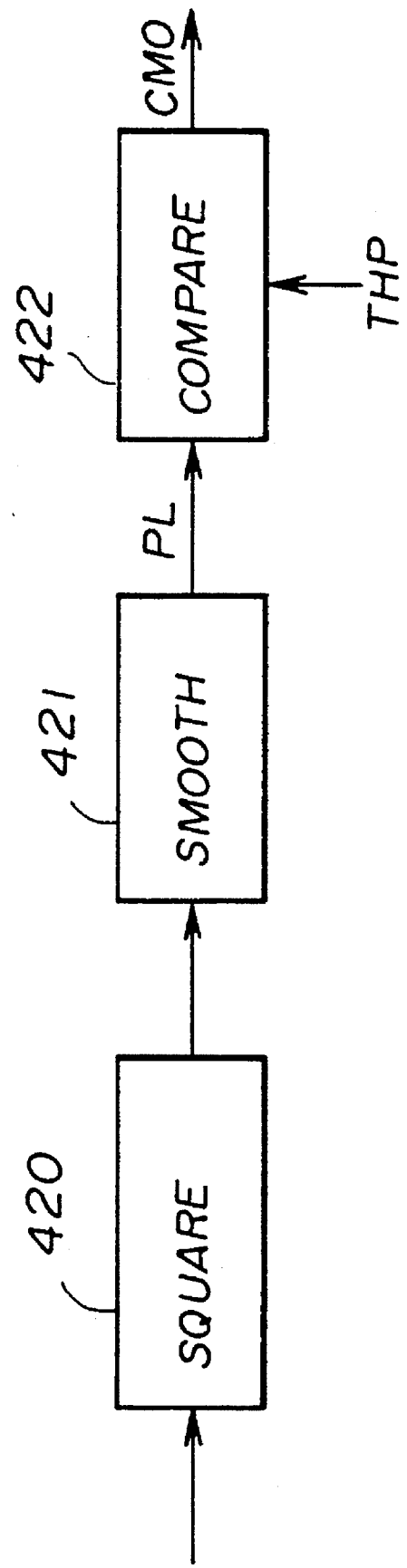
FIG. 7 is a block diagram of another structure of the input abnormality sensing unit.

FIG. 7 shows the structure of the input abnormality sensing unit 352 shown in FIG. 6. As shown in FIG. 7, the input abnormality sensing unit 352 comprises a square circuit 420, a smoothing circuit 421, and a comparator circuit 422, and senses an instantaneous break from the received signal RS itself. The square circuit 420 squares the received signal RS. The smoothing circuit 421 smooths the output signal of the square circuit 420. The comparator circuit 422 compares the smoothed square result PL with a predetermined threshold value THP, and indicates "1" showing an input abnormality when the signal PL is less than the threshold value THP. In other cases, the comparator circuit 422 indicates "0". The result of the comparison is denoted by CMO.

Figure 8:
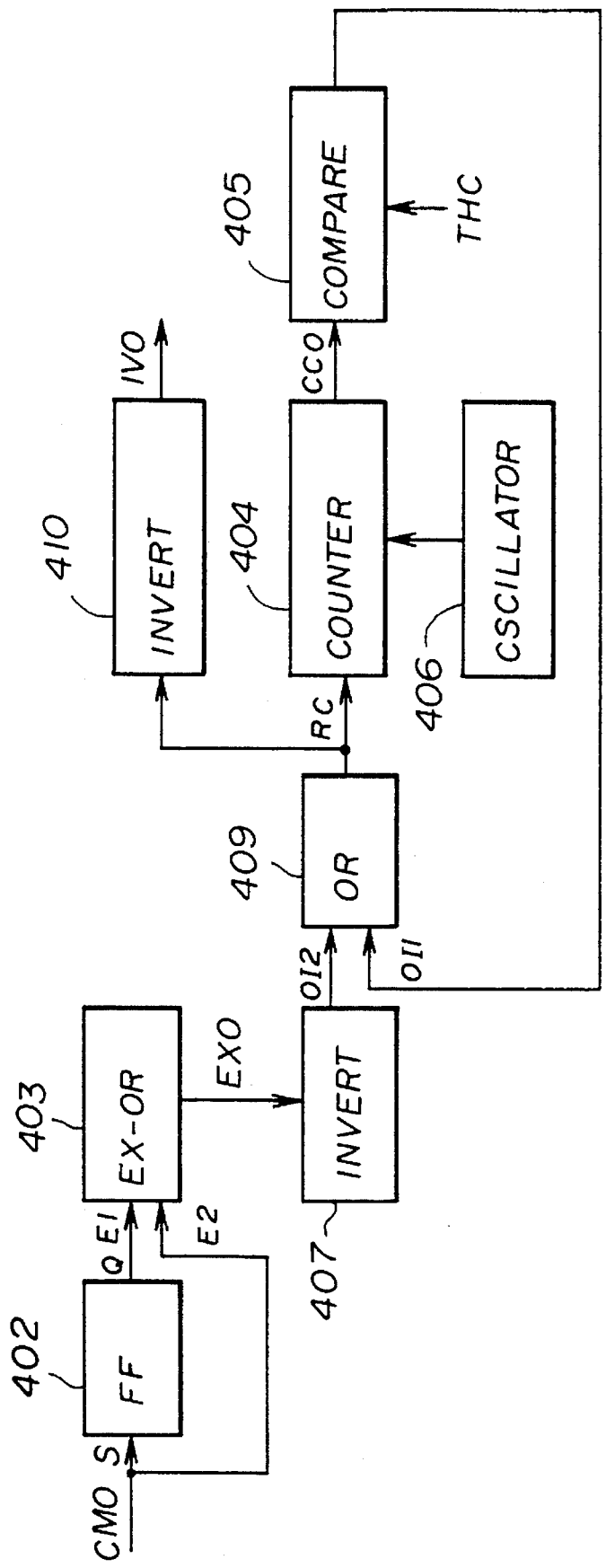
FIG. 8 is a block diagram of another structure of the input abnormality sensing unit.

In the configurations shown in FIGS. 8 and 7, the received signal RS is squared by the square circuit 420 and is then smoothed by the smoothing circuit 421, so that the signal PL indicating the power of the received signal RS can be obtained. The signal PL is compared with the predetermined threshold value THP by the comparator circuit 422, and the comparison result CMO is applied to the controller 301. When the received signal RS is instantaneously broken, the signal PL becomes approximately "0", and hence the comparator circuit 422 outputs "1" indicating an input abnormality. When the received signal RL is recovered from the instantaneous break, the output signal of the comparator circuit 401 switches to "0" indicating input normality. At this time, the output signal EXO of the exclusive-OR circuit 403 of the controller 301 switches from "0" to "1". As in the previous case, the cutoff unit 300 prevents the timing error signal TE from being applied to the multiplier 211. Hence, the integrator 212 holds the current value, which facilitates the rapid recovery of the timing synchronization.

FIG. 8 shows another configuration of the controller 301, which comprises, in addition to the aforementioned flip-flop circuit 402 and the exclusive-OR circuit 403 shown in FIG. 5, an oscillator 406, an inverting circuit 407, an OR circuit 409, a counter circuit 404, a comparator circuit 405, and an inverting circuit 410. The inverting circuit 407 inverts the output signal EXO of the exclusive-OR circuit 403. The oscillator 406 generates pulses having a predetermined frequency. The counter circuit 404 counts pulses from the oscillator 406. A signal RC from the OR circuit 409 is applied, as a reset signal, to the counter circuit 404. The comparator circuit 405 compares a counter output CCO from the counter circuit 404 with the predetermined threshold value THC. The comparator circuit 405 outputs a value "1" when the counter output CCO is greater than the threshold value THC, and outputs a value "0" in other cases. The inverting circuit 410 inverts the output signal of the OR circuit 409, and outputs an inversion version IVO thereof to the cutoff signal 300 as a control signal. The OR circuit 409 receives an output signal OI2 of the inverting circuit 407, and an output signal OI1 of the comparator circuit 405.

In the configuration of the controller 301 shown in FIG. 8, the output signal EXO of the exclusive-OR circuit 403 is "0" in the normal receiving state, and the output signal RC of the logic OR circuit 409 is "1". Hence, the counter circuit 404 is maintained in the reset state. As a result, the output signal CCO of the counter circuit 404 is "0", and the output signal of the comparator circuit 405 is "0". As has been described previously, when the receiving signal is broken and then recovered, the output signal EXO of the exclusive-OR circuit 403 switches to "1", and the output signal of the inverting circuit 407 switches to "0". Further, the output signal of the OR gate 409 switches to "0", and the counter circuit 404 is released from the reset state. Hence, the counter circuit 404 starts to count pulses from the oscillator 406. At this time, the output signal IVO of the inverting circuit 410 switches to "1", and the timing error signal TE is prevented from being applied to the multiplier 211. The output signal CCO of the counter circuit 404 increases as the elapse of time. When the predetermined time based on the oscillation frequency of the oscillator 406 and the THC elapses and then the signal CCO becomes greater than the THC, the output signal of the comparator 405 switches to "1". Hence, the output signal RC of the OR circuit 409 switches to "1", and the counter circuit 404 is reset again. Thus, the counter output CCO switches to "0", and the output signal of the comparator circuit 405 switches to "0". As a result, the cutoff operation of the cutoff unit 300 is terminated at that time, and the timing error signal TE is applied to the multiplier 211 again. In this manner, the timing reproduction device returns to the normal operation.

In the state in which the timing synchronization between the transmitter and the receiver has been established, the integrator 212 holds the value corresponding to the difference between the symbol frequencies of the transmitter and the receiver. However, the value held in the integrator 212 slightly varies. Hence, if the timing error signal is cut off at the time when the value held in the integrator 212 slightly varies, the integrator 212 holds a value slightly different from the value corresponding to the difference between the symbol frequencies of the transmitter and the receiver. If such a state continues for a long time, the erroneous correction (although error is quite small) is continuously performed. This is not desirable.

When the controller 301 is configured as shown in FIG. 8, the timing reproduction device stops the cutoff operation and instead starts the normal operation after the predetermined time elapses. Hence, the timing error signal TE is sent to the multiplier 211 and the integrator 212, and the value held in the integrator 212 can be corrected, after a large timing difference due to an abrupt timing change is eliminated. Hence, the stable timing reproduction can be performed.

Figure 9:
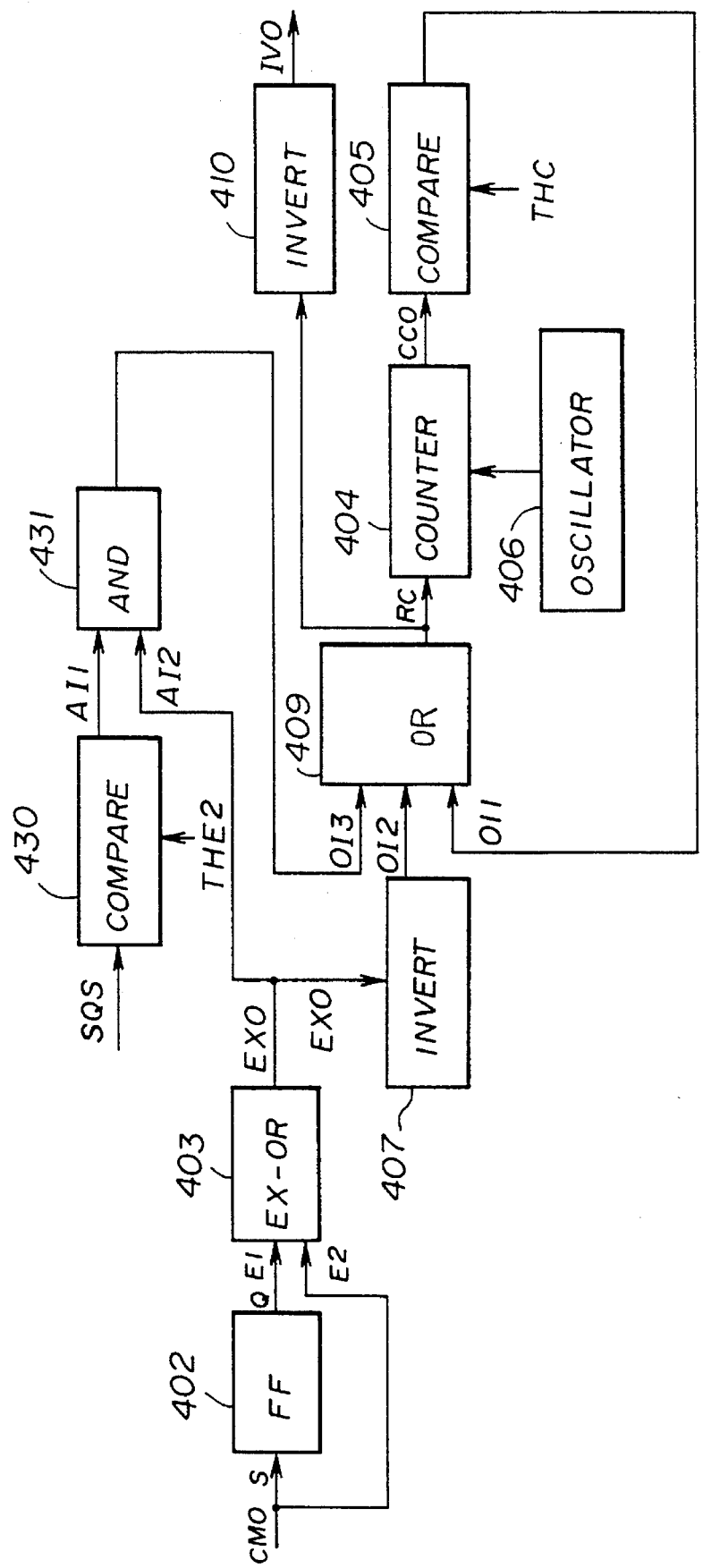
FIG. 9 is a block diagram of yet another structure of the input abnormality sensing unit.

FIG. 9 is a block diagram of another configuration of the controller 301. An input abnormality sensing unit 302 connected to the controller 301 shown in FIG. 9 is configured in the same manner as shown in FIG. 2. While the cutoff unit 300 is cutting off the timing error signal TE, the input abnormality sensing unit monitors the value obtained by smoothing the sum of the square of the real part of the complex decision error signal CES and the square of the imaginary part thereof. When the complex decision error signal ECS decreases, the cutoff operation is terminated. That is, the controller 301 shown in FIG. 9 comprises, in addition to the structural elements shown in FIG. 8, a comparator circuit 430, and an AND circuit 431.

A description will now be given of the operation of the timing reproduction device having the controller 301 configured as shown in FIG. 9. A threshold value THE2 is set so as to be slightly greater than the value of the signal SQS obtained in the normal receiving state after the timing synchronization is established. In the normal receiving state, the complex decision error signal CES is small, and the output signal SQS of the smoothing circuit 400 is also small. Hence, the comparator circuit 430 generates "1". In this state, the output signal EXO of the exclusive-OR circuit 403 indicates "0", and the output signal of the AND circuit 431 is zero. As a result, the output signal of the comparator circuit 420 does not relate to the subsequent control operation. When the received signal is recovered from a break, the output signal EXO of the exclusive-OR circuit 403 switches from "0" to "1".

When there is no timing difference between the transmitter and the receiver, the signal CES is small, and the signal SQS is also small. Hence, the comparator circuit 430 generates "1", and two input signals AI1 and AI2 of the AND circuit 431 respectively indicate "1". In this state, the output signal of the AND circuit 431 indicates "1" and the output signal of the OR circuit 409 indicates "1". Thereby, the counter circuit 404 is reset, and the cutoff operation on the timing error signal TE is not carried out.

When there is a timing error between the transmitter and the receiver after the received signal is recovered from a break, the signal CES indicates a large value, and the comparator circuit 430 generates "0". Further, the AND circuit 431 indicates "0". Hence, as in the case of the operation of the configuration shown in FIG. 8, the counter circuit 404 is released from the reset state, and the cutoff operation on the timing error signal TE is restarted. If the timing difference is small, and it takes a short time to recover the timing synchronization, the signal CES reduces, and the signal SQS also reduces. Hence, the output signal of the comparator circuit 430 switches to "1". Since the signal EXO indicates "1", the output signal of the AND circuit 431 switches to "1", and the output signal RC of the OR circuit 409 switches to "1". As a result, the counter circuit 404 is reset, and the cutoff operation is terminated.

That is, by employing the configuration of the controller 301 shown in FIG. 9, it becomes possible to terminate the cutoff operation before the predetermined time elapses which depends on the oscillation frequency of the oscillator 406 and the predetermined value THC applied to the comparator circuit 405 and to prevent unnecessary cutoff operation. If there is a problem other than the timing error, such as a deterioration of the quality of the communications medium (noise) when the received signal is recovered from a break, the signal CES will be large and high-speed follow operation is not terminated because such a problem cannot be distinguished from the timing difference. Even in such a case, the counter circuit 404 is reset after the predetermined time elapses which is dependent on the oscillation frequency of the oscillator 406 and the predetermined value THC applied to the comparator circuit 405. Hence, unnecessary cutoff operation can be terminated.

In the configuration shown in FIG. 9, the comparator circuit 405 can be eliminated. If the timing difference is small, the configuration shown in FIG. 9 does not need a long time necessary to terminate the cutoff operation, as compared to the configuration shown in FIG. 8. Further, the configuration shown in FIG. 9 is simpler than that shown in FIG. 8. However, there is a possibility that the cutoff operation may not be terminated in the situation in which there is a problem other than the timing difference, such as a deterioration of the quality of the communications medium.

As has been described above, the first embodiment of the present invention was made taking into account the following matters. First, the frequency difference between the transmitter and the receiver seldom changes, and only the phase changes in practice. Hence, the value held in the integrator 212 should not change. Second, in many cases, an abrupt timing change causes an instantaneous break of the received signal. The first embodiment copes with an abrupt timing change by preventing the timing error signal TE from being applied to the integrator 212. Hence, a delay in recovery of the timing synchronization due to an abrupt timing change can be prevented.

In the configuration shown in FIG. 2, there is a possibility that the complex decision error signal CES may slightly lag behind the timing error signal TE. If an abrupt timing change occurs under the above condition, the timing error signal TE indicating a large value is applied to the multiplier 211 and the integrator 212 before the cutoff operation starts. However, even in the above case, the coefficient by which the timing error signal should be multiplied at the multiplier 211 is made small. Hence, the output signal of the integrator 212 dully changes in response to the timing error signal TE indicating a large value. Hence, even if the complex decision error signal CES may slightly lag behind the timing error signal TE and the cutoff operation starts with a slight delay, there is little change in the output signal of the integrator 212, and satisfactory effects resulting from the cutoff operation can be obtained.

In the first embodiment of the present invention, the input abnormality sensing unit 302 or 352 senses an instantaneous break of the received signal. Alternatively, it is possible to employ sensing methods other than the above. In the first embodiment, the controller 301 and the cutoff unit 300 cut off the timing error signal TE after abnormality in the received signal (an instantaneous break thereof, for example) is eliminated. Alternatively, it is possible to cut off the timing error signal TE when abnormality of the received signal (an instantaneous break thereof, for example) starts. For example, a structure can be employed which detects the fact that the level of the received signal RS becomes equal to or less than a predetermined value. In this case, the cutoff operation on the timing error signal TE can be performed while the received signal is being broken.

Figure 10:
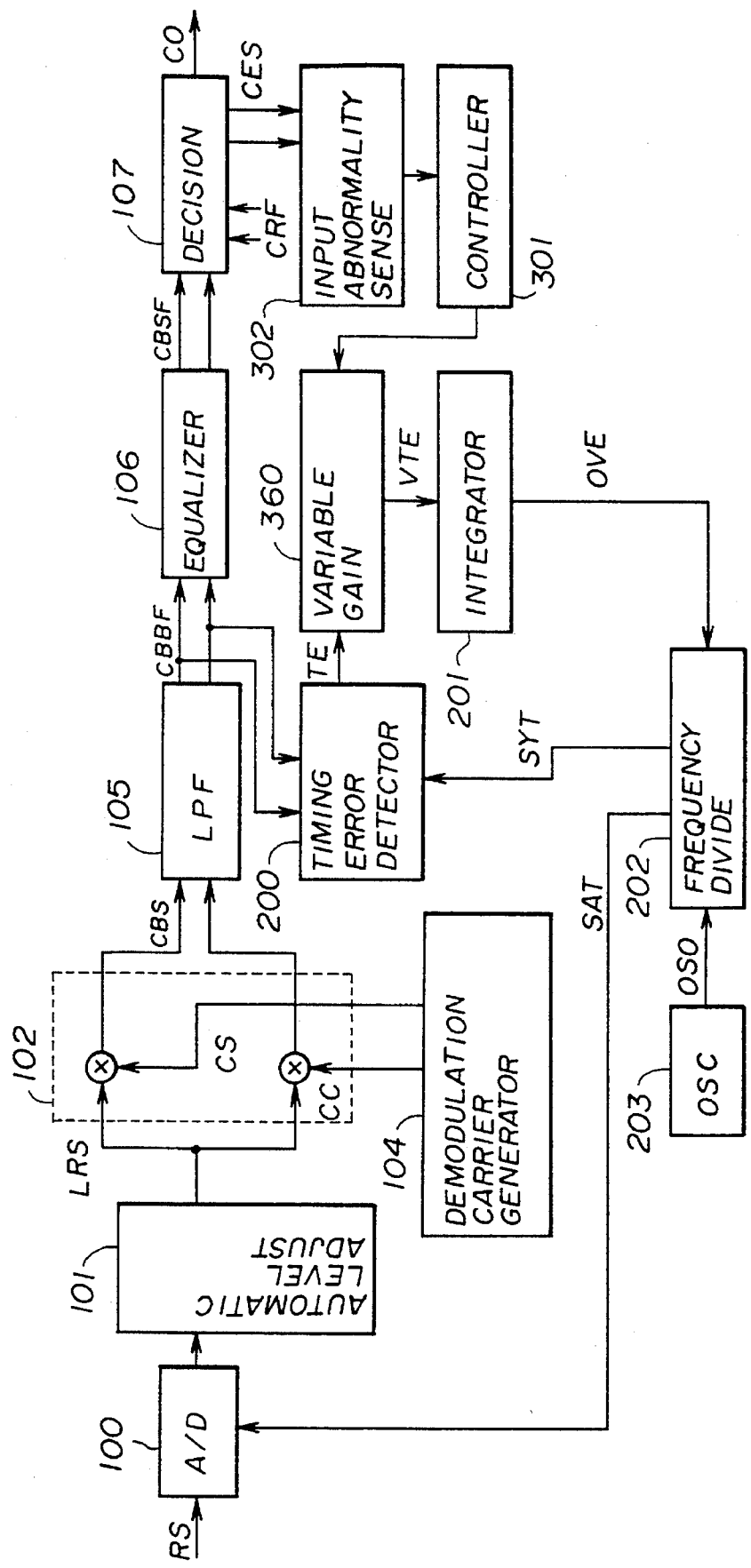
FIG. 10 is a block diagram of a timing reproduction device according to a second embodiment of the present invention.

FIG. 10 is a block diagram of a timing reproduction device according to a second embodiment of the present invention. The second embodiment of the present invention does not have the multiplier 211, the integrator 212 and the adder 210 used to reduce the steady phase error in the first embodiment. In FIG. 10, parts that are the same as parts shown in FIG. 2 are given the same reference numbers as previously. The second embodiment is intended to sense the state that an abrupt timing change will occur and increase the following speed of the timing reproduction device, so that the time necessary to recover the timing synchronization can be reduced. For the above purpose, a variable gain unit 360 is employed in lieu of the cutoff unit 300 used in the first embodiment. The gain of the variable gain unit 360 can be controlled by the controller 301 on the basis of an input abnormality sensing signal from the input abnormality sensing unit 302. More particularly, the variable gain unit 360 multiplies the timing error signal TE by a variable gain coefficient VC dependent on the output signal of the controller 301, and outputs a signal VTE corresponding to the result of the above multiplication to the integrator 201. The variable gain coefficient VC indicates, for example, "1" when the output signal of the controller 301 indicates "0", and indicates, for example, "4" when the output signal of the controller 301 indicates "1".

The second embodiment of the present invention does not include any structural elements corresponding to the multiplier 211, the integrator 212 and the adder 210 used in the first embodiment thereof. The timing error signal TE is multiplied by the variable gain coefficient VC at the variable gain unit 360, and the result of the multiplication is directly applied to the integrator 201. Further, in the configuration shown in FIG. 10, the input abnormality sensing unit 302 and the controller 301 can be substituted to the unit and the controller respectively shown in FIGS. 4 and 5.

A description will now be given of the operation of the second embodiment of the present invention. It will now be assumed that the input abnormality sensing unit 302 and the controller 301 are configured as shown in FIGS. 4 and 5. In transmission using the normal public lines, an abrupt timing change between the transmitter and the receiver seldom takes place. With the above in mind, the following speed of the timing reproduction circuit is reduced (made slow) after the timing synchronization is established. Thereby, a jitter occurring in the timing reproduction circuit can be reduced.

However, in the mobile digital communications systems, an abrupt timing change occurs when a movable station switches to communicate with another ground station (switching of zones) due to a positional change of the movable station. If the variable gain unit 360 is not used, the timing reproduction is carried out at a low following speed even after the abrupt timing change disappears. Hence, it takes a long time to recover the timing synchronization.

In the second embodiment, when an instantaneous break in the received signal or an impulse noise or the like occurs and the received signal recovers from such abnormality, the output signal EXO of the exclusive-OR circuit 403 of the controller 301 switches from "0" to "1". In the case where the variable gain coefficient VC of the variable gain unit 360 assumes "1" when the output signal of the controller 301 indicates "0" and assumes "4" when the output signal thereof indicates "1", the output signal of the controller 301 indicates "1" after the received signal is recovered from the abnormality, and the variable gain coefficient "4" is selected. This coefficient is multiplied by the timing error signal TE, and the signal equal to four times the timing error signal TE is applied to the integrator 201. As a result, the time necessary for the result of the integration by the integrator 201 to reach the predetermined value THIP or THIN can be reduced, and the frequency in which the overflow signal OVF not equal to "0" is generated by the integrator 201 increases. Hence, the timing adjustment due to a change in the frequency-dividing rate M of the frequency divider 202 is frequently performed after the received signal is recovered from the abnormal state. In this manner, the following speed of the timing reproduction increases, and the timing synchronization can be rapidly re-established.

Figure 11:
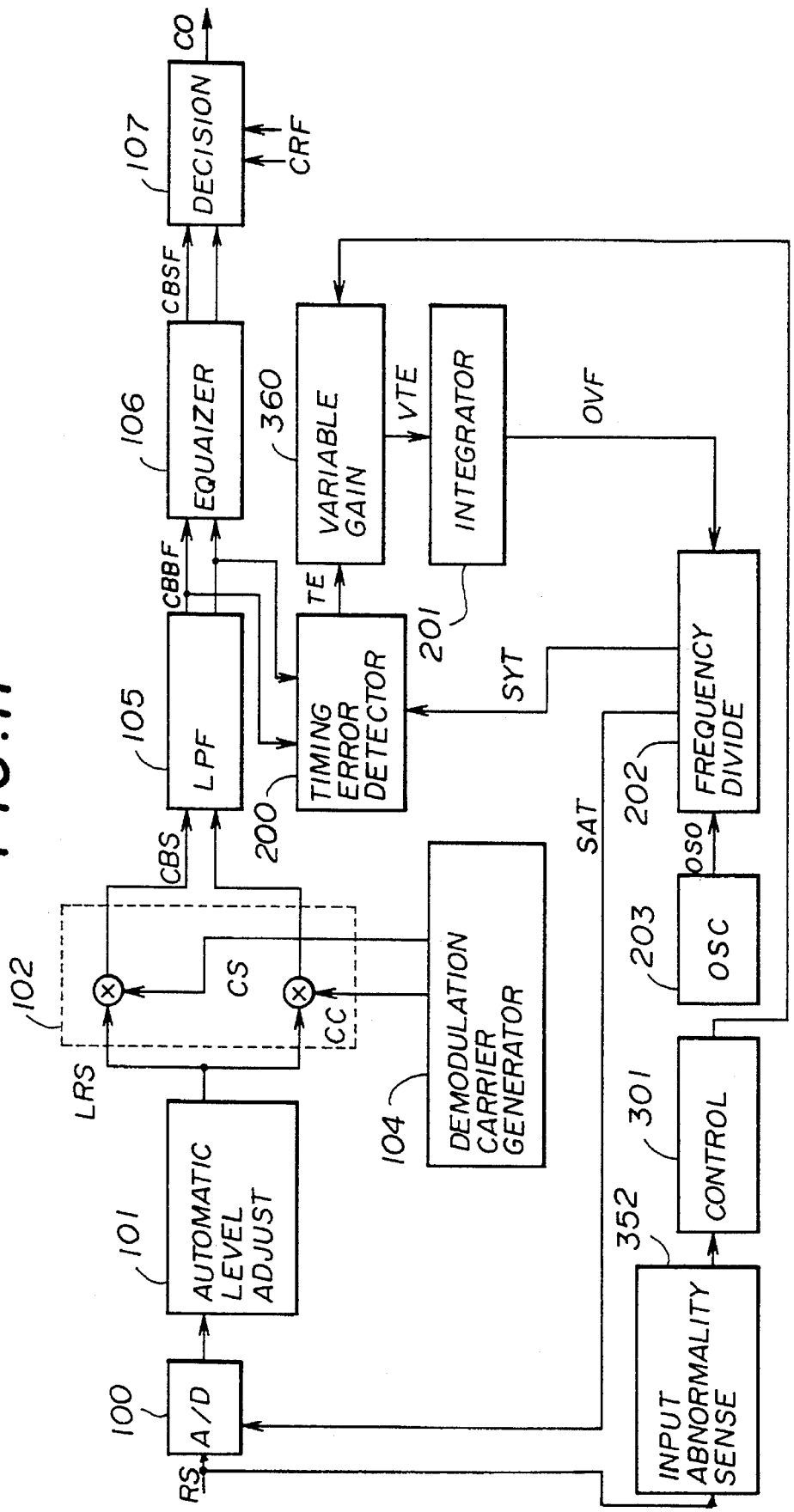
FIG. 11 is a block diagram of a variation of the timing reproduction device shown in FIG. 10.

FIG. 11 illustrates a variation of the timing reproduction device shown in FIG. 10. The input abnormality sensing unit 352 can be configured in the same manner as shown in FIG. 7. When an abnormality in the received signal RS occurs and is then eliminated, the output signal EXO of the controller 301 changes from "0" to "1". Thereby, the variable gain coefficient of the variable gain unit 360 changes from "1" to "4", and the signal equal to the four times the timing error signal TE is applied to the integrator 201. Hence, the timing adjustment is frequently performed, and the following speed of the timing reproduction increases. In this manner, the timing synchronization can be rapidly reestablished.

Figure 12:
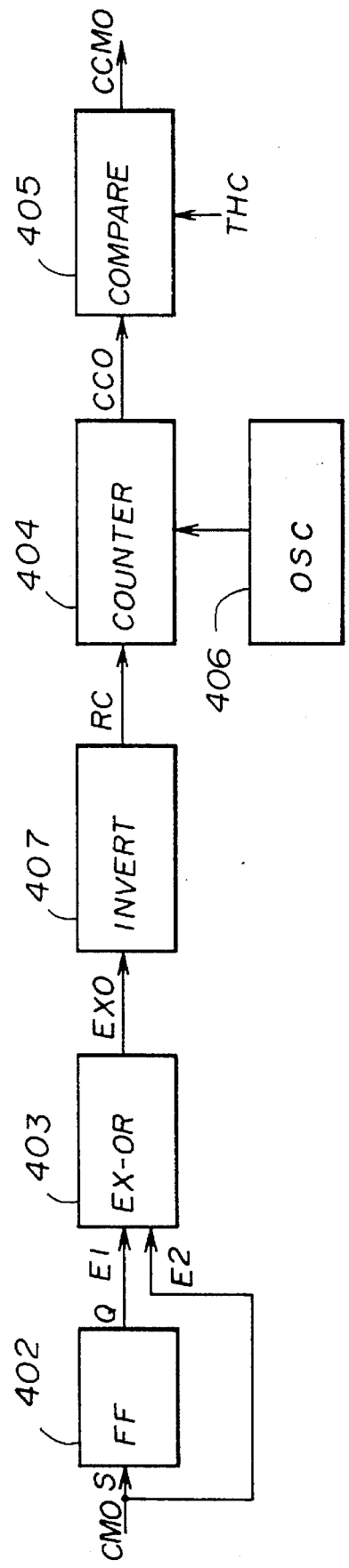
FIG. 12 is a block diagram of the structure of a controller shown in FIG. 10.
Figure 13:
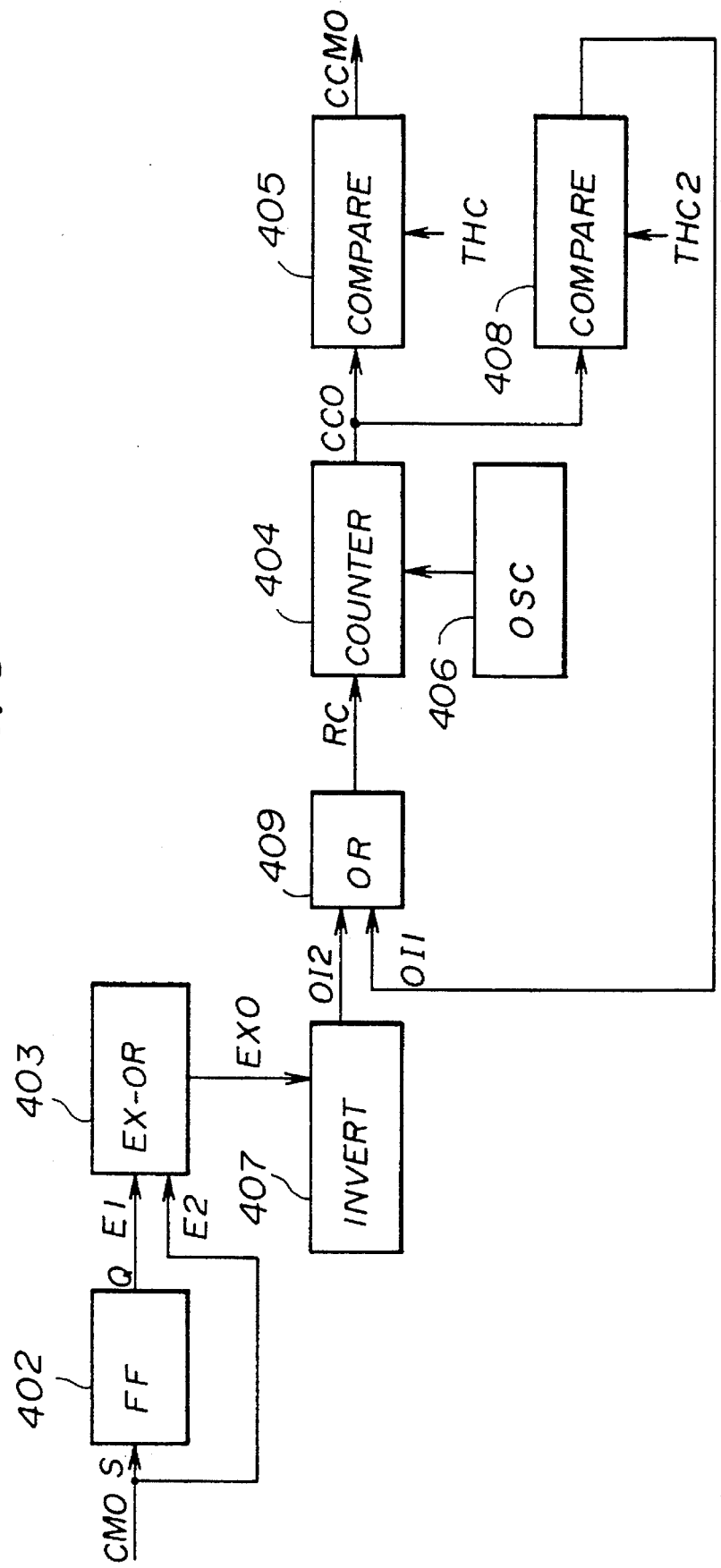
FIG. 13 is a block diagram of another structure of the controller shown in FIG. 10.
Figure 14:
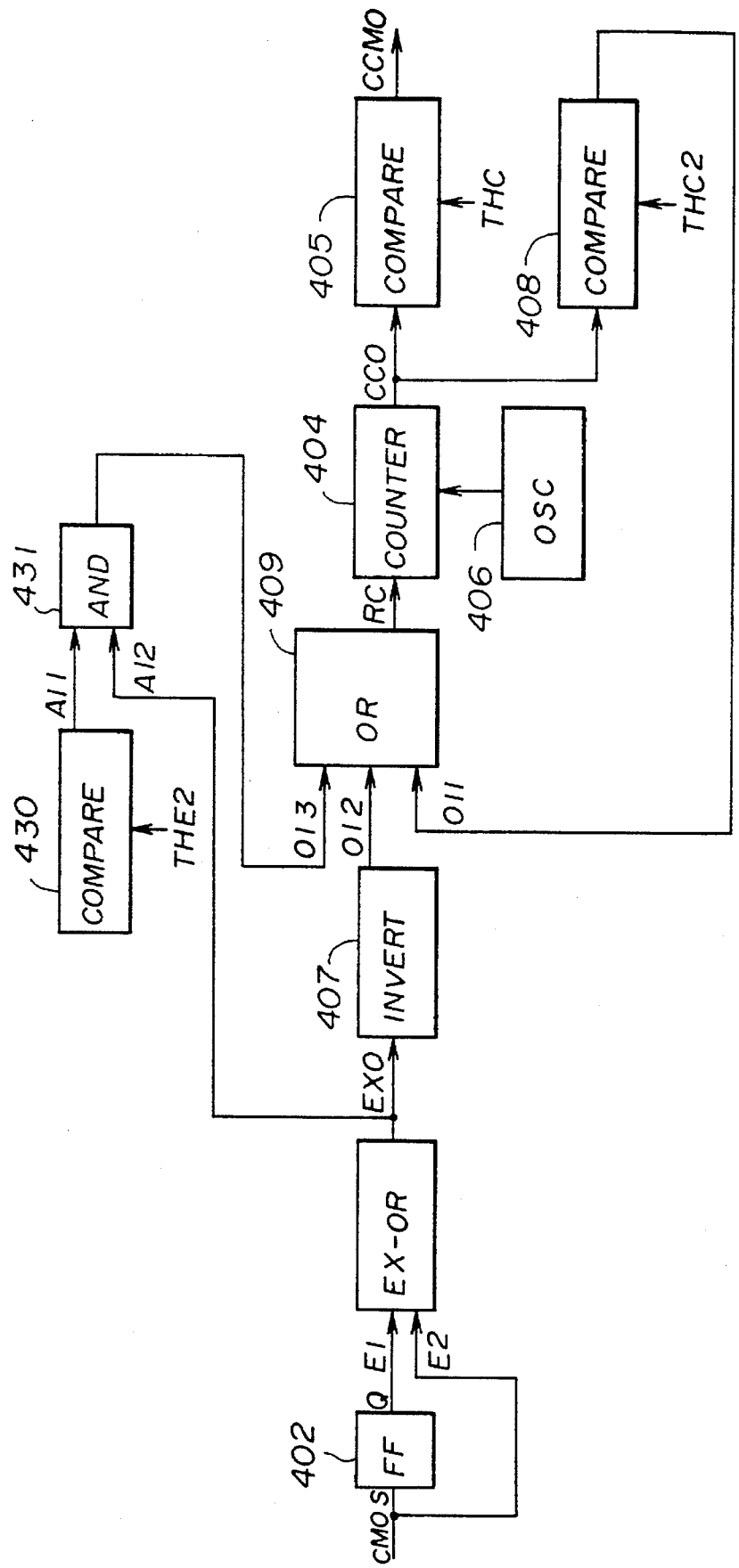
FIG. 14 is a block diagram of yet another structure of the controller shown in FIG. 10.

The controller 301 of the second embodiment of the present invention can be configured as shown in FIG. 12, FIG. 13 or FIG. 14. The configuration of the controller 301 shown in FIG. 12 comprises, in addition to the flip-flop circuit 402 and the exclusive-OR circuit 403 shown in FIG. 5, inverting circuit 407, oscillator 406, counter circuit 404, and comparator circuit 405. The inverting circuit 407 inverts the output signal EXO of the exclusive-OR circuit 403. The oscillator 406 generates pulses having a predetermined frequency. The counter circuit 404, which is reset by the output signal RC of the inverting circuit 407, counts pulses generated by the oscillator 406. The comparator circuit 405 compares the counter output CCO of the counter circuit 404 with the predetermined threshold value THC. The comparator circuit 405 generates "1" when the counter output CCO is greater than the threshold value THC, and generates "0" in other cases. The output signal of the comparator circuit 405 is denoted by CCMO.

In the case where the controller 301 is configured as shown in FIG. 12, in the normal receiving state, the output signal EXO of the exclusive-OR circuit 403 assumes "0". Hence, the output signal OI1 of the inverting circuit 407 is equal to "1", and the counter circuit 404 is maintained in the reset state. Thus, the output signal CCO of the counter circuit 404 is equal to "0", and the output signal CCMO of the comparator circuit 405 is also equal to "0". After the received signal is recovered from an instantaneous break or an impulse noise, the output signal EXO of the exclusive-OR circuit 403 switches to "1", and the output signal of the inverting circuit 407 switches to "0". Hence, the counter circuit 404 is released from the reset state, and starts to count the pulses generated by the oscillator 406. The output signal CCO of the counter circuit 404 increases with time. When the predetermined time dependent on the oscillation frequency of the oscillator 406 and the threshold value THC has elapsed and the signal CCO becomes greater than the threshold value THC, the output signal CCMO of the comparator circuit 405 switches to "1". Hence, by controlling the variable gain coefficient VC of the variable gain unit 300 by means of the signal CCMO, it is possible to increase the following speed of the timing reproduction circuit after a predetermined-time standby after the abnormality is eliminated. Hence it becomes possible to prevent the timing reproduction circuit from following up an erroneous timing error signal at high speed in the state where the modem has not yet been settled in the halfway of recovery from input abnormality.

In the case where the controller 301 is configured as shown in FIG. 13, the output signal EXO of the exclusive-OR circuit 403 is equal to "0". Hence, the output signal OI1 of the inverting circuit 407 is equal to "1", and the output signal RC of the OR circuit 408 is also equal to "1". Hence, the counter circuit 404 is maintained in the reset state. As a result, the output signal CCO of the counter circuit 404 is equal to "0", and the output signal CCMO of the comparator circuit 405 is also equal to "0". When the received signal has been recovered from an instantaneous break or impulse noise, the output signal EXO of the exclusive-OR circuit 403 switches to "1", and the output signal of the inverting circuit 407 switches to "0". Further, the output signal of the OR circuit 409 is equal to "0", and the counter circuit 404 is released from the reset state and starts to count the pulses derived from the oscillator 406. The output signal CCO of the counter circuit 406 increases as the elapse of time. When the given time dependent on the oscillation frequency of the oscillator 406 and the threshold value THC and the signal CCO becomes greater than the threshold value THC, the output signal CCMO of the comparator 405 switches to "1". As in the case of the configuration shown in FIG. 12, the variable gain coefficient of the variable gain unit 360 becomes equal to, for example, "4", and the following speed of the timing reproduction is increased. When a further time elapses and the counter output CCO of the counter circuit 404 becomes greater than the threshold value THC2, the output value of the comparator circuit 408 switches to "1". Hence, the output signal of the OR circuit 409 switches to "1", and the counter circuit 404 is reset again. As a result, the counter output CCO of the counter circuit 404 becomes "0", and the outputs of the comparators 405 and 408 become "0". The variable gain coefficient VC of the variable gain unit 360 returns to a normal value, for example, "1", and increasing of the following speed of the timing reproduction is terminated. The time up to the above termination depends on the oscillation frequency of the oscillator 406 and the threshold value THC2. By setting the above time to the time necessary to restore the timing synchronization between the transmitter and the receiver in the high-speed following state (in which the value of the variable gain coefficient VC is larger than the normal value), the high-speed following operation can be terminated when the timing synchronization is recovered. In this manner, the following speed of the timing reproduction after the recovery of timing synchronization can be returned to the normal following speed. Hence, a jitter can be suppressed.

The configuration of the controller 301 shown in FIG. 14 uses the input abnormality sensing unit 302 shown in FIG. 10. The controller 301 shown in FIG. 14 monitors the value obtained by smoothing the sum of the square of the real part of the complex decision error signal CES and the square of the imaginary part thereof. When the complex decision error signal ECS decreases, the cutoff operation is terminated. That is, the controller 301 shown in FIG. 14 comprises, in addition to the configuration shown in FIG. 13, the comparator circuit 430 and the AND circuit 431. The comparator circuit 430 compares the output signal SQS from the smoothing circuit 400 with the threshold value THE2, and generates "1" when the signal SQS is less than the threshold value THE2, generating "0" in other cases. The AND circuit 431 calculates an AND operation on the comparison result AI1 from the comparator circuit 430 and the output signal EXO from the exclusive-OR circuit 403, and applies the result OI3 of the AND operation to the OR circuit 409.

A description will now be given of the operation of the timing reproduction device employing the controller 301 shown in FIG. 14. The threshold value THE2 is set to a value slightly greater than the value of the signal SQS obtained in the normal receiving state in which the timing synchronization has been established. In the normal receiving state, the complex decision error signal CES is small, and the output signal SQS of the smoothing circuit 400 is also small. Thus, the comparator circuit 430 outputs the value "1". In this state, the output signal EXO of the exclusive-OR circuit 403 is equal to "0", and the output signal of the comparator circuit 420 does not relate to the subsequent control operation.

When the received signal is recovered from an instantaneous break or an impulse noise, the output signal EXO of the OR circuit 403 switches from "0" to "1", as has been described previously. At this time, if there is no timing difference between the transmitter and the receiver, the signal CES is small, and the signal SQS is also small. Hence, the comparator circuit 430 generates the value "1", and the two inputs AI1 and AI2 of the AND circuit 431 are respectively supplied with "1". Hence, the output signal of the AND circuit 431 switches to "1", and the output signal of the OR circuit 409 switches to "1". Thereby, the counter circuit 404 is reset, and the high-speed following operation of the timing reproduction device is not performed.

If there is a timing difference between the transmitter and the receiver at the time when the received signal is recovered from an instantaneous break or an impulse noise, the signal CES indicates a large value. Hence, the comparator circuit 430 generates the value "0", and the output signal of the AND circuit 431 outputs "0". As in the case of the configuration shown in FIG. 13, the counter circuit 404 is released from the reset state, and the high-speed following operation of the timing reproduction device starts after the elapse of the time dependent on the oscillation frequency of the oscillator 406 and the threshold value THC applied to the comparator circuit 405. If the timing difference is very small, and the timing synchronization is rapidly recovered, the signal CES becomes small, and the signal SQS becomes small. Hence, the output signal of the comparator circuit 431 switches to "1", and the output signal RC of the OR circuit 409 also switches to "1". Hence, the counter circuit 404 is reset, and the high-speed following operation is terminated.

That is, the configuration shown in FIG. 14 makes it possible to terminate the high-speed following operation before the elapse of the given time dependent on the oscillation frequency of the oscillator 406 and the predetermined threshold value THC applied to the comparator circuit 408. Hence, it is possible to prevent execution of unnecessary high-speed following operation and suppress jitter effectively. If there is a problem other than the timing error, such as a deterioration of the quality of the communications medium (noise) when the received signal is recovered from a break, the signal CES will be large and high-speed follow operation is not terminated because such a problem cannot be distinguished from the timing difference. Even in such a case, the counter circuit 404 is reset after the predetermined time elapses which is dependent on the oscillation frequency of the oscillator 406 and the predetermined value THC applied to the comparator circuit 408. Hence, unnecessary cutoff operation can be terminated.

In the configuration shown in FIG. 14, the comparator circuit 408 can be eliminated. If the timing difference is small, the configuration shown in FIG. 14 does not need a long time necessary to terminate the cutoff operation, as compared to the configuration shown in FIG. 13. Further, the configuration shown in FIG. 14 is simpler than that shown in FIG. 13. However, there is a possibility that the cutoff operation may not be terminated in the situation in which there is a problem other than the timing difference, such as a deterioration of the quality of the communications medium.

According to the present invention, the following advantages can be obtained.

It is determined whether or not the timing error signal should be applied to the integrator for holding data necessary to maintain the timing synchronization, by sensing abnormality in the received signal. Hence, the data held in the integrator is little affected even when the timing abruptly changes, and the time necessary to recover the timing synchronization can be reduced.

The gain is varied (after recovery) and the timing error signal is multiplied by the varied gain when abnormality in the received signal is sensed. Hence, the high-speed following operation on the timing synchronization can be performed even if an abrupt timing change occurs.

Abnormality in the received signal is sensed by monitoring the value obtained by smoothing the sum of the square of the real part of the complex decision error signal and the square of the imaginary part thereof. Hence, the input abnormality sensing unit is simple.

Abnormality in the received signal is also sensed by monitoring the input level of the received signal. Hence, it is possible to accurately sense a zone switching without being affected by noise.

The cutoff operation or the high-speed following operation is terminated when a predetermined time has elapsed after starting the cutoff operation or the high-speed following operation. Hence, the timing reproduction operation can be stably performed.

The cutoff operation or the high-speed following operation is also terminated by a decrease in the timing error signal. Hence, it is possible to minimize the period during which the cutoff operation or high-speed following operation is ON.

The cutoff operation or the high-speed following operation is also terminated when the received signal becomes greater than a predetermined level after starting the cutoff operation or the high-speed following operation. Hence, it is possible to minimize the period during which the cutoff operation or high-speed following operation is ON.

The present invention is not limited to the specifically disclosed embodiments, and variations and modifications may be made without departing from the scope of the present invention.

What is claimed is:

1. A timing reproduction device comprising:

timing error detecting means for detecting an error in timing of a signal transferred between a transmission side and a reception side on the basis of a received signal and for generating a timing error signal;

integrating means, coupled to said timing error detecting means, for integrating the timing error signal to thereby hold data necessary to maintain a timing synchronization;

sensing means for sensing an abnormality in the received signal of either an abrupt timing change in said received signal or a signal level of the received signal that is less than a predetermined signal threshold value;

timing synchronizing means, coupled to the timing error detecting means, for executing a timing synchronizing operation for maintaining the timing synchronizing by referring to the data held in the integrating means;

cutoff means, coupled between said timing error detecting means and said integrating means and connected to said sensing means, for executing a cutoff operation which prevents the timing error signal from being applied to the integrating means on the basis of the abnormality sensed by said sensing means; and wherein said sensing means comprises means for comparing an input level of the received signal prior to demodulation of the received signal with the predetermined threshold value and means for determining whether or not the abnormality in the received signal occurs on the basis of a comparison result generated by the means for comparing.

2. A timing reproduction device comprising:

timing error detecting means for detecting an error in timing of a signal transferred between a transmission side and a reception side on the basis of a received signal and for generating a timing error signal;

integrating means, coupled to said timing error detecting means, for integrating the timing error signal to thereby hold data necessary to maintain a timing synchronization;

sensing means for sensing an abnormality in the received signal of either an abrupt timing change in said received signal or a signal level of the received signal that is less than a predetermined signal threshold value;

timing synchronizing means, coupled to the timing error detecting means, for executing a timing synchronizing operation for maintaining the timing synchronizing by referring to the data held in the integrating means;

cutoff means coupled between said timing error detecting means and said integrating means and connected to said sensing means, for executing a cutoff operation which prevents the timing error signal from being applied to the integrating means on the basis of the abnormality sensed by said sensing means;

wherein said sensing means further comprises:

demodulator means for demodulating the received signal and generating a demodulated signal;

decision means, coupled to said demodulator means, for generating a complex error signal having a real-part component and an imaginary-part component by comparing the demodulated signal with a reference signal having a value which the demodulated signal should originally assume;

calculating means, coupled to said decision means, for squaring the real-part component and the imaginary part component and for calculating a sum of the squared real-part component and the squared imaginary-part component; and comparator means, coupled to said calculating means, for comparing the sum with a predetermined threshold value and determining whether or not the abnormality in the received signal occurs, on the basis of a comparison result.

3. The timing reproduction device as claimed in claim 1, wherein said cutoff means comprises means for stopping the cutoff operation when a predetermined time has elapsed after the cutoff operation starts.

4. A timing reproduction device comprising:

timing error detecting means for detecting an error in timing of a signal transferred between a transmission side and a reception side on the basis of a received signal and for generating a timing error signal;

integrating means, coupled to said timing error detecting means, for integrating the timing error signal to thereby hold data necessary to maintain a timing synchronization;

sensing means for sensing an abnormality in the received signal of either an abrupt timing change in said received signal or a signal level of the received signal that is less than a predetermined signal threshold value;

timing synchronizing means, coupled to the timing error detecting means, for executing a timing synchronizing operation for maintaining the timing synchronizing by referring to the data held in the integrating means;

cutoff means, coupled between said timing error detecting means and said integrating means and connected to said sensing means, for executing a cutoff operation which prevents the timing error signal from being applied to the integrating means on the basis of the abnormality sensed by said sensing means, wherein said cutoff means further comprises:
demodulator means for demodulating the received signal and generating a demodulated signal;
decision means, coupled to said demodulator means, for generating a complex error signal having a real-part component and an imaginary-part component by comparing the demodulated signal with a reference signal having a value which the demodulated signal should originally assume;
calculating means, coupled to said decision means, for squaring the real-part component and the imaginary part component of the complex error signal and for calculating a sum of the squared real-part component and the squared imaginary-part component; and
comparator means, coupled to said calculating means, for terminating the cutoff operation when said sun becomes smaller than the predetermined threshold value after the timing error signal is cutoff by the cutoff operation so that a transfer of the timing error signal is restored.

5. The timing reproduction device as claimed in claim 1, wherein said cutoff means comprises means for comparing an input level of the received signal with the predetermined threshold value and for terminating the cutoff operation when the input level of the received signal becomes greater than the predetermined threshold value.

6. A timing reproduction device comprising:
timing error detecting means for detecting an error in timing of a signal transferred between a transmission side of a reception side on the basis of a received signal and for generating a timing error signal;
sensing means for sensing an abnormality in the received signal of either an abrupt timing change in the received signal or a signal level of the received signal that is less than a predetermined threshold value;
variable gain means, coupled to said timing error detecting means and said sensing means, for changing a variable gain and for multiplying the timing error signal by the variable gain on the basis of the abnormality in the input signal and for generating a gain-controlled timing error signal;
integrating means, coupled to said variable gain means, for integrating the gain-controlled timing error signal to thereby hold data necessary to maintain a timing synchronization;
timing synchronizing means, coupled to the timing detecting means, for executing a timing synchronizing operation for maintaining the timing synchronization by referring to the data held in the integrating means; and
wherein said sensing means comprises means for comparing an input level of the received signal prior to demodulation of the received signal with the predetermined threshold value and means for determining whether or not the abnormality in the received signal occurs on the basis of a comparison result generated by the means for comparing.

7. A timing reproduction device comprising:
timing error detecting means for detecting an error in timing of a signal transferred between a transmission side of a reception side on the basis of a received signal and for generating a timing error signal;
sensing means for sensing an abnormality in the received signal of either an abrupt timing change in the received signal or a signal level of the received signal that is less than a predetermined threshold value;
variable gain means, coupled to said timing error detecting means and said sensing means, for changing a variable gain and for multiplying the timing error signal by the variable gain on the basis of the abnormality in the input signal;
integrating means, coupled to said variable gain means, for integrating the gain-controlled timing error signal to thereby hold data necessary to maintain a timing synchronization;
timing synchronizing means, coupled to the timing detecting means, for executing a timing synchronizing operation for maintaining the timing synchronization by referring to the data held in the integrating means, wherein said sensing means further comprises:
demodulator means for demodulating the received signal and generating a demodulated signal;
decision means, coupled to said demodulator means, for generating a complex error signal having a real-part component and an imaginary-part component by comparing the demodulated signal with a reference signal having a value which the demodulated signal should originally assume;
calculating means, coupled to said decision means, for squaring the real-part component and the imaginary part component of the complex error signal and for calculating a sum of the squared real-part component and the squared imaginary-part component; and
comparator means, coupled to said calculating means, for comparing the sum with a predetermined threshold value and determining whether or not the abnormality in the received signal occurs, on the basis of a comparison result.

8. The timing reproduction device as claimed in claim 6, wherein said sensing means comprises means for comparing an input level of the received signal with the predetermined threshold value and determining whether or not the abnormality in the received signal occurs on the basis of a comparison result.

9. A timing reproduction device comprising:
timing error detecting means for detecting an error in timing of a signal transferred between a transmission side of a reception side on the basis of a received signal and for generating a timing error signal;
sensing means for sensing an abnormality in the received signal of either an abrupt timing change in the received signal or a signal level of the received signal that is less than a predetermined threshold value;
variable gain means, coupled to said timing error detecting means and said sensing means, for changing a variable gain and for multiplying the timing error signal by the variable gain on the basis of the abnormality in the input signal;
integrating means, coupled to said variable gain means, for integrating the gain-controlled timing error signal to thereby hold data necessary to maintain a timing synchronization;
timing synchronizing means, coupled to the timing detecting means, for executing a timing synchronizing operation for maintaining the timing synchronization by referring to the data held in the integrating means,
wherein said variable gain means further comprises means for changing the variable gain when a predetermined time elapses after the sensing means detects a recovery from the abnormality.

10. The timing reproduction device as claimed in claim 6, wherein said variable gain means comprises means for multiplying, when the abnormality is sensed, the timing error signal by the variable gain equal to a first value and for multiplying the timing error signal by the variable gain equal to a second value that is different from the first value when a predetermined time has elapsed after the abnormality is eliminated.

11. A timing reproduction device comprising:

timing error detecting means for detecting an error in timing of a signal transferred between a transmission side of a reception side on the basis of a received signal and for generating a timing error signal;

sensing means for sensing an abnormality in the received signal of either an abrupt timing change in the received signal or a signal level of the received signal that is less than a predetermined threshold value;

variable gain means, coupled to said timing error detecting means and said sensing means, for changing a variable gain and for multiplying the timing error signal by the variable gain on the basis of the abnormality in the input signal;

integrating means, coupled to said variable gain means, for integrating the gain-controlled timing error signal to thereby hold data necessary to maintain a timing synchronization;

timing synchronizing means, coupled to the timing detecting means, for executing a timing synchronizing operation for maintaining the timing synchronization by referring to the data held in the integrating means, wherein said sensing means further comprises:

demodulator means for demodulating the received signal and generating a demodulated signal;

decision means, coupled to said demodulator means, for generating a complex error signal having a real-part component and an imaginary-part component by comparing the demodulated signal with a reference signal having a value which the demodulated signal should originally assume;

calculating means, coupled to said decision means, for squaring the real-part component and the imaginary part component of the complex error signal and for calculating a sum of the squared real-part component and the squared imaginary-part component; and comparator means, coupled to said calculating means, for comparing the sum with the predetermined threshold value and determining whether or not the sum becomes smaller than the predetermined threshold value, and wherein said variable gain means comprises means for, after the variable gain is changed, returning the variable gain to an original value when the sum becomes smaller than said predetermined threshold value.

12. The timing reproduction device as claimed in claim 6, further comprising means for determining whether or not an input level of the received signal becomes greater than a predetermined second threshold value after the variable gain is changed, wherein said variable gain means comprises means for changing the variable gain to a first value when it is determined that the input level of the received signal becomes greater than the predetermined second threshold value.

13. A device according to claim 1, wherein said signal transferred between a transmission side and a reception side is a modulated signal.

14. A device according to claim 6, wherein said signal transferred between a transmission side and a reception side is a modulated signal.

* * * * *